US010273389B2

(12) United States Patent
Hoshino et al.

(10) Patent No.: US 10,273,389 B2
(45) Date of Patent: Apr. 30, 2019

(54) RESIN COMPOSITION

(71) Applicant: DENKI KAGAKU KOGYO KABUSHIKI KAISHA, Tokyo (JP)

(72) Inventors: Takako Hoshino, Shibukawa (JP); Yoshitsugu Goto, Shibukawa (JP); Kimihiko Yoda, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 14/417,376

(22) PCT Filed: Jul. 24, 2013

(86) PCT No.: PCT/JP2013/070013
§ 371 (c)(1),
(2) Date: Jan. 26, 2015

(87) PCT Pub. No.: WO2014/017524
PCT Pub. Date: Jan. 30, 2014

(65) Prior Publication Data
US 2015/0210905 A1    Jul. 30, 2015

(30) Foreign Application Priority Data

Jul. 26, 2012  (JP) ................................. 2012-165431

(51) Int. Cl.
| | |
|---|---|
| *H01L 51/00* | (2006.01) |
| *H05B 33/04* | (2006.01) |
| *C09J 163/00* | (2006.01) |
| *C08L 63/00* | (2006.01) |
| *C08G 59/68* | (2006.01) |
| *H01L 51/52* | (2006.01) |
| *H05B 33/10* | (2006.01) |
| *B32B 37/12* | (2006.01) |
| *B32B 38/00* | (2006.01) |
| *C09J 109/00* | (2006.01) |
| *C08G 59/24* | (2006.01) |
| *C08G 59/34* | (2006.01) |
| *C08K 5/159* | (2006.01) |
| *C08K 5/5419* | (2006.01) |

(52) U.S. Cl.
CPC ............ *C09J 163/00* (2013.01); *B32B 37/12* (2013.01); *B32B 38/0008* (2013.01); *C08G 59/24* (2013.01); *C08G 59/34* (2013.01); *C08G 59/687* (2013.01); *C08K 5/159* (2013.01); *C08K 5/5419* (2013.01); *C08L 63/00* (2013.01); *C09J 109/00* (2013.01); *H01L 51/0024* (2013.01); *H01L 51/5253* (2013.01); *H05B 33/04* (2013.01); *H05B 33/10* (2013.01); *B32B 2037/1253* (2013.01); *B32B 2307/422* (2013.01); *B32B 2310/0831* (2013.01); *B32B 2363/00* (2013.01); *B32B 2457/206* (2013.01); *H01L 51/5246* (2013.01)

(58) Field of Classification Search
CPC ........... H01L 33/62; H01L 2924/01079; H01L 2224/48; H01L 2924/01078; H01L 33/486; H01L 51/5253; H01L 51/50; H01L 51/0024; C08G 59/687; H05B 33/10; H05B 33/04; C08L 63/00
USPC ............................. 438/22, 26; 257/40, 59, 79
See application file for complete search history.

(56) References Cited

U.S. PATENT DOCUMENTS

| | | | | |
|---|---|---|---|---|
| 4,401,537 | A * | 8/1983 | Chern ................... | C08G 59/68 349/153 |
| 6,692,986 | B1 * | 2/2004 | Bayer ................. | H01L 51/5246 438/116 |
| 8,828,500 | B2 * | 9/2014 | Arai ...................... | C08G 59/226 156/349 |
| 2004/0110857 | A1 * | 6/2004 | Kanai ...................... | C08G 2/10 522/100 |
| 2005/0227082 | A1 * | 10/2005 | Shimazu ............. | H01L 51/5259 428/413 |
| 2007/0144400 | A1 * | 6/2007 | Ito .......................... | C08G 65/18 106/31.14 |
| 2009/0051274 | A1 * | 2/2009 | Hayashi .............. | H01L 51/5246 313/504 |
| 2010/0137530 | A1 * | 6/2010 | Arai ...................... | C08G 59/226 525/524 |
| 2010/0152315 | A1 * | 6/2010 | Yamamoto .......... | C08G 59/686 522/170 |
| 2010/0304284 | A1 | 12/2010 | Rinker ............................. | 430/7 |

(Continued)

FOREIGN PATENT DOCUMENTS

| | | |
|---|---|---|
| CN | 1298061 C | 1/2007 |
| CN | 101747590 A | 6/2010 |

(Continued)

OTHER PUBLICATIONS

European Search Report dated Sep. 8, 2015, issued to European Application No. 13823713.6.

(Continued)

*Primary Examiner* — Thinh T Nguyen
(74) *Attorney, Agent, or Firm* — Stein IP, LLC

(57) ABSTRACT

Provided is a resin composition comprising (A) an epoxy compound, (B) an epoxy resin, and (C) a photocationic polymerization initiator. Preferably, this resin composition has a moisture content of 1000 ppm or less and a chlorine content of 1000 ppm or less. This resin composition is an energy beam-curable resin composition having accurate coating properties, excellent adhesiveness, low moisture permeability, excellent adhesive durability, and excellent storage stability.

15 Claims, No Drawings

(56) References Cited

U.S. PATENT DOCUMENTS

| | | | |
|---|---|---|---|
| 2011/0282010 A1 | 11/2011 | Fujita | 525/396 |
| 2012/0207991 A1 | 8/2012 | Arai et al. | 428/216 |
| 2013/0153880 A1* | 6/2013 | Yamamoto | H01L 51/5246 257/40 |
| 2014/0087136 A1* | 3/2014 | Osaku | G03F 7/0757 428/141 |
| 2014/0154627 A1* | 6/2014 | Tanabe | G03F 7/027 430/280.1 |
| 2014/0167021 A1 | 6/2014 | Arai et al. | 257/40 |

FOREIGN PATENT DOCUMENTS

| | | |
|---|---|---|
| CN | 102282210 A | 12/2011 |
| EP | 2 475 223 A1 | 7/2012 |
| JP | S 54-13596 A | 2/1979 |
| JP | S 58-189223 A | 11/1983 |
| JP | S 63-254121 A | 10/1988 |
| JP | 10-74583 A | 3/1998 |
| JP | 10-173336 A | 6/1998 |
| JP | H 11-224771 A | 8/1999 |
| JP | 2001-181221 A | 7/2001 |
| JP | 2004-61925 A | 2/2004 |
| JP | 2005-336314 A | 12/2005 |
| JP | 2006-63261 A | 3/2006 |
| JP | 2006-70152 A | 3/2006 |
| JP | 2006-70221 A | 3/2006 |
| JP | 2006-225545 A | 8/2006 |
| JP | 2007-46035 A | 2/2007 |
| JP | 2008-59868 A | 3/2008 |
| JP | 2008-59945 A | 3/2008 |
| JP | 2008-115338 A | 5/2008 |
| JP | 2008-285679 A | 11/2008 |
| JP | 20009-259656 A | 11/2009 |
| JP | 2009-286954 A | 12/2009 |
| JP | 2010-18797 A | 1/2010 |
| JP | 2010-24364 A | 2/2010 |
| JP | 2010-507696 A | 3/2010 |
| JP | 2010-126699 A | 6/2010 |
| JP | 2010-163566 A | 7/2010 |
| JP | 2010-248500 A | 11/2010 |
| JP | 2011-63727 A | 3/2011 |
| JP | 2011-111598 A | 6/2011 |
| JP | 2012-87282 A | 5/2012 |
| JP | 2012-151109 A | 8/2012 |
| WO | WO 2007/049385 A1 | 5/2007 |
| WO | WO 2011/104997 A1 | 9/2011 |

OTHER PUBLICATIONS

International Search Report dated Nov. 2, 2013, issued to the corresponding International Application No. PCT/JP2013/070013.
Chinese Office Action dated Feb. 3, 2016, issued by the Chinese Patent Office in corresponding application 201380039675.0.
Notification of Reasons for Refusal dated May 2, 2017, issued by the Japanese Patent Office in corresponding application JP 2014-526965.

\* cited by examiner

RESIN COMPOSITION

CROSS-REFERENCE TO RELATED APPLICATIONS

This application is a national stage of International Application No. PCT/JP2013/070013, filed Jul. 24, 2013 in the U.S. Patent and Trademark Office. This application claims the benefit of priority to Japanese Application No. 2012-165431, filed Jul. 26, 2012, in the Japanese Patent Office. All disclosures of the document(s) named above are incorporated herein by reference.

BACKGROUND OF THE INVENTION

Technical Field

The present invention relates to resin compositions, and to, for example, a cured product and an adhesive used for sealing of an organic EL element.

Background Art

Much attention has been paid to organic EL elements as an element that allows for high-luminance light emission. Unfortunately, moisture content causes deterioration, which decreases luminescence properties.

In order to solve such a problem, technologies have been developed that prevent the deterioration due to moisture content by sealing an organic EL element. Examples of the technologies include a method for sealing an organic EL element by using a sealant made of frit glass (see Patent Literature 1).

Also disclosed is a sealing method in which not only the periphery of a substrate is sealed, but also filling is used for an interlayer of the substrate to complete pasting. In this case, disclosed is a resin composition with which the interlayer is filled (see Patent Literatures 2 and 3).

In addition, disclosed is an energy beam-curable resin composition that satisfies curing performance, adhesiveness, and storage stability (Patent Literature 4).

Still more Patent Literatures 5 to 7 also disclose various resin compositions although these resin compositions are used for other purposes.

Further, in a technology for sealing an organic EL element, it is described (in Patent Literature 8) that a filler layer made of a thermosetting resin material (not curable by UV irradiation) used for sealing of the organic EL element has a moisture content of 0.01 wt % or less. Also, in Patent Literature 8, it is described that a peripheral seal layer made of a UV-curable resin material used for sealing of the organic EL element has a moisture content of 0.1 wt % or less.

Still more Patent Literature 9 discloses a photosensitive additive adhesive with a hydrolyzable chlorine content of 100 ppm or less although the resin composition is used for another purpose. Furthermore, Patent Literature 10 discloses a liquid crystal sealant with a hydrolyzable chlorine content of 600 ppm or less.

Moreover, in a technology for sealing an organic EL element, it is described (in Patent Literature 11) that crown ether is added to a sealant for the organic EL element. In addition, it is described (in Patent Literature 12) that crown ether is added to a photocurable resin composition for a touch panel although the resin composition is used for another purpose.

Patent Literature 1: JP-A-10-74583
Patent Literature 2: JP-A-2005-336314
Patent Literature 3: JP-A-2008-59945
Patent Literature 4: JP-A-2010-248500
Patent Literature 5: JP-A-2009-286954
Patent Literature 6: JP-A-2010-507696
Patent Literature 7: JP-A-2001-181221
Patent Literature 8: JP-A-2008-59868
Patent Literature 9: JP-A-10-173336
Patent Literature 10: JP-A-2004-61925
Patent Literature 11: JP-A-2012-151109
Patent Literature 12: JP-A-2011-111598

SUMMARY OF THE INVENTION

Technical Problem

Unfortunately, the conventional technologies as described in the above literatures have had room for improvement regarding the following points.

According to Patent Literature 1, when mass production is implemented, adopted is a method in which an organic EL element is interposed between substrates with low moisture permeability, such as glass pieces, to seal the periphery. In this case, this structure is a hollow sealing structure. Accordingly, it is impossible to prevent moisture content from infiltrating into the inside of the hollow sealing structure. Unfortunately, this leads to deterioration of the organic EL element.

In Patent Literatures 2 and 3, their resin compositions have increased moisture permeability, so that an organic EL element is deteriorated and sufficient adhesion cannot be obtained. Unfortunately, this results in detachment of the organic EL element. In addition, the organic EL element is subjected to metal vapor deposition, so that metal corrosion leads to deterioration of the organic EL element.

Unfortunately, in Patent Literature 4, it is difficult to use various photopolymerization initiators to examine a wide variety of components of a resin composition for sealing of an organic EL element without selecting a specific photopolymerization initiator such as bis-(4-t-butyl-phenyl)-iodonium-tris(trifluoromethanesulfonyl)methide.

Patent Literatures 5 to 7, in the first place, disclose resin compositions used for other purposes and are silent on specification of their moisture content.

Patent Literature 8 sets forth moisture content and a combination of: an overcoat layer containing a carbon- and hydrogen-based olefin or cyclic olefin resin; a filler layer containing an epoxy-based (not UV-curable) thermosetting resin material; and a peripheral seal layer containing an epoxy-based UV-curable resin material. This combination causes insufficient adhesiveness and adhesive durability. Also, a step of sealing an organic EL element is complicated.

Although Patent Literatures 9 and 10 each set forth chlorine content, they, in the first place, disclose resin compositions used for other purposes and are silent on specification of their moisture content.

Patent Literatures 11 and 12 describe that crown ether is added to a sealant for an organic EL element or a photocurable resin composition for a touch panel, but neither sets forth moisture content.

The present invention has been made in view of the above situations. It is an object of the present invention to provide a resin composition that is unlikely to deteriorate an organic EL element when used for sealing the organic EL element.

Solution to Problem

An aspect of the present invention provides a resin composition comprising: (A) an epoxy compound; (B) an epoxy resin; and (C) a photocationic polymerization initiator, wherein moisture content is 1000 ppm or less and chlorine content is 1000 ppm or less. This resin composition is unlikely to deteriorate an organic EL element when used for sealing the organic EL element.

Still more the above resin composition is just an embodiment of the present invention. Substantially the same configuration and effects apply to an adhesive, sealant for an organic EL element, cured product, organic EL device, display, and manufacturing method therefor according to the present invention.

Effects of Invention

The present invention can prevent deterioration of an organic EL element.

DETAILED DESCRIPTION OF THE EMBODIMENTS

Descriptions of Terms

As used herein, the term "energy beam-curable resin composition" means a resin composition that can be cured by energy beam irradiation. As used herein, the term "energy beams" means energy beams represented by UV light, visible light, etc.

As used herein, the term "X to Y" means a range of from "X or higher" to "Y or lower". For example, the term "A to B" means A or more and B or less.

Hereinafter, embodiments of the present invention will be described in detail.

Embodiment 1: Resin Composition

It is preferable to use an energy beam-curable resin composition as a resin composition according to this embodiment. The energy beam-curable resin composition comprises: (A) an epoxy compound; (B) an epoxy resin; (C) a photocationic polymerization initiator; and (D) a photosensitizer.

The following describes components of the resin composition according to this embodiment.

((A) Epoxy Compound)

The resin composition according to this embodiment contains (A) an epoxy compound. When the epoxy compound is used, the resin composition according to this embodiment exhibits low moisture permeability and excellent adhesiveness and adhesive durability.

Examples of an alicyclic epoxy compound of the epoxy compound (A) include: compounds as obtained by using a suitable oxidizer such as hydrogen peroxide and peroxides to epoxidize a compound with at least one cycloalkane ring such as a cyclohexene, cyclopentene ring and a pinene ring, or derivatives thereof; and alicyclic epoxy compounds such as a hydrogenated epoxy compound as obtained by hydrogenating an aromatic epoxy compound such as a bisphenol A-type epoxy compound. One or more of these compounds may be selectively used.

In view of moisture permeability, the epoxy compound has a molecular weight of preferably less than 300 and more preferably from 100 to 280. As used herein, the term "molecular weight" refers to a number-average molecular weight. Regarding the molecular weight, a gel permeation chromatography (GPC) measurement is used to calculate a number-average molecular weight that is converted to a polystyrene unit. For example, the following conditions are used for the measurement:

Solvent (mobile phase): THF;
Degasifier: ERC-3310 manufactured by ERMA Inc.;
Pump: PU-980 manufactured by JASCO Corporation;
Flow rate: 1.0 ml/min;
Auto-sampler: AS-8020 manufactured by Tosoh Corporation;
Column oven: L-5030 manufactured by Hitachi, Ltd.;
Preset temperature: 40° C.;
Column configuration: a total of 4 columns including 2 TSK guard column MP (xL) 6.0 mm ID×4.0 cm, manufactured by Tosoh Corporation, and 2 TSK-GELMULTIPORE HXL-M 7.8 mm ID×30.0 cm, manufactured by Tosoh Corporation;
Detector: RI L-3350 manufactured by Hitachi, Ltd.; and
Data processing: SIC480 datastation.

Among them, preferred is an alicyclic epoxy compound in view of excellent adhesiveness and photocuring performance. More preferred is an alicyclic epoxy compound containing at least one epoxy group and at least one ester group per molecule.

Examples of the alicyclic epoxy compound include, but are not particularly limited to, a dicyclopentadiene-based epoxy compound or an alicyclic epoxy compound containing at least one epoxy group and at least one ester group per molecule, including 3,4-epoxycyclohexenylmethyl-3,4-epoxycyclohexene carboxylate and 3,4-epoxycyclohexylmethyl (meth)acrylate.

((B) Epoxy Resin)

Examples of the epoxy resin (B) include, but are not particularly limited to, an epoxidized polybutadiene resin; an epoxy resin with a cyclohexyl group; a bisphenol A-type epoxy resin; a bisphenol F-type epoxy resin; a bisphenol S-type epoxy resin; a biphenyl-based epoxy resin; a naphthalene-based epoxy resin; a fluorene-based epoxy resin; a novolacphenol-based epoxy resin; a cresol novolac epoxy resin and a modified product thereof. One or more of these epoxy resins may be selectively used. Among them, preferred is an epoxy resin without an aromatic group in view of excellent adhesiveness and photocuring performance. Among the epoxy resins without an aromatic group, preferred are one or more of resins selected from the group consisting of an epoxidized polybutadiene resin and an epoxy resin with a cyclohexyl group in view of excellent adhesiveness and photocuring performance. More preferred is the epoxidized polybutadiene resin.

In view of moisture permeability, the epoxy resin has a molecular weight of preferably from 300 to 5000. As used herein, the term "molecular weight" refers to a number-average molecular weight. Regarding the molecular weight, a gel permeation chromatography (GPC) measurement was used to calculate a number-average molecular weight that was converted to a polystyrene unit.

In view of workability, photocuring performance, adhesiveness, moisture permeability, and adhesive durability, a usage amount of the component (B) is 0.5 part by mass or more per total of 100 parts by mass of the components (A) and (B), more preferably 1 part by mass or more, still more preferably 3 parts by mass or more, and still more preferably 5 parts by mass or more. In view of workability, photocuring performance, adhesiveness, moisture permeability, and adhesive durability, the usage amount of the component (B) is 50 parts by mass or less per total of 100 parts by mass of the components (A) and (B), more preferably 30 parts by mass or less, still more preferably 25 parts by mass or less, and still more preferably 20 parts by mass or less.

((C) Photocationic Polymerization Initiator)

The resin composition according to this embodiment contains (C) a photocationic polymerization initiator. When the photocationic polymerization initiator is used, the resin composition according to this embodiment can be cured by energy beam (e.g., UV light) irradiation.

Examples of the photocationic polymerization initiator (C) include: but are not particularly limited to, aryl sulfonium salt derivatives (e.g., Cyracure UVI-6990, Cyracure UVI-6974, manufactured by The Dow Chemical Company; Adeka Optomer SP-150, Adeka Optomer SP-152, Adeka Optomer SP-170, Adeka Optomer SP-172, manufactured by ADEKA CORPORATION; CPI-100P, CPI-101A, CPI-200K, CPI-210S, LW-S1, manufactured by San-Apro Ltd.; CIBACURE 1190, manufactured by Double Bond Chemical Ind., Co., Ltd.); aryl iodonium salt derivatives (e.g., Irgacure 250 manufactured by Ciba Specialty Chemical Co., Ltd.; RP-2074 manufactured by Rhodia Japan Ltd.); allene-ion complex derivatives; diazonium salt derivatives; triazine-based initiators; and other acid generators such as halides. A cation species in the photocationic polymerization initiator is preferably an onium salt represented by the following formula (1).

Examples of the photocationic polymerization initiator (C) include: but are not particularly limited to, the onium salt represent by the following formula (1):

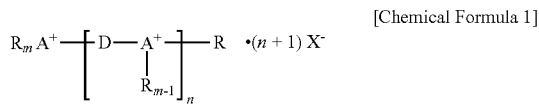

[Chemical Formula 1]

(A is an element of groups VIA to VIIA and has a valence of m; m=1 to 2; n=0 to 3; the "m" and "n" are each preferably an integer; R denotes an organic group attached to A; D has a structure represented by the following formula (2):

[Chemical Formula 2]

wherein E represents a divalent group; G is —O—, —S—, —SO—, —SO$_2$—, —NH—, —NR'—, —CO—, —COO—, —CONH—, C$_{1-3}$ alkylene, or phenylene (R' is C$_{1-5}$ alkyl or C$_{6-10}$ aryl); a=0 to 5; (a+1) E and (a) G are each the same or different; the "a" is preferably an integer; R' herein is the same as described above; X$^-$ is a counter ion of onium; and the number of ions is (n+1) per molecule).

Examples of the onium ion in the compound represented by formula (1) include, but are not particularly limited to, 4-(phenylthio)phenyl diphenyl sulfonium, bis[4-(diphenylsulfonio)phenyl]sulfide, bis[4-{bis[4-(2-hydroxyethoxyl)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 4-(4-benzoylphenylthio)phenyl diphenyl sulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(di-p-tolyl)sulfonio]thioxanthone, 2-[(diphenyOsulfonio]thioxanthone, 4-[4-(4-tert-butylbenzoyl)phenylthio]phenyldi-p-tolylsulfonium, 4-(4-benzoylphenylthio)phenyl diphenyl sulfonium, 5-(4-methoxyphenyl)thianthrenium, 5-phenylthianthrenium, diphenyl phenacyl sulfonium, 4-hydroxyphenyl methylbenzyl sulfonium, 2-naphthylmethyl(1-ethoxycarbonyl)ethylsulfonium, 4-hydroxyphenyl methylphenacyl sulfonium, and octadecyl methylphenacyl sulfonium.

R is an organic group attached to A and represents C$_{6-30}$ aryl, C$_{4-30}$ heterocycle, C$_{1-30}$ alkyl, C$_{2-30}$ alkenyl, or C$_{2-30}$ alkynyl. These groups are optionally substituted by at least one selected from the group consisting of: alkyl, hydroxy, alkoxy, alkyl carbonyl, aryl carbonyl, alkoxy carbonyl, aryloxy carbonyl, arylthio carbonyl, acyloxy, arylthio, alkylthio, aryl, heterocycle, aryloxy, alkyl sulfinyl, aryl sulfinyl, alkyl sulfonyl, aryl sulfonyl, alkylene oxy, amino, cyano, and nitro; and halogens. The number of R is "m+n(m−1)+1" and each of R is the same or different. In addition, two or more R are directly bonded each other or attached via —O—, —S—, —SO—, —SO$_2$—, —NH—, —NR'—, —CO—, —COO—, —CONH—, C$_{1-3}$ alkylene, or phenylene to optionally form a ring structure containing the element A. Here, R' is C$_{1-5}$ alkyl or C$_{6-10}$ aryl.

Examples of the above C$_{6-30}$ aryl include: monocyclic aryl such as phenyl; and condensed polycyclic aryl such as naphthyl, anthracenyl, phenanthrenyl, pyrenyl, chrysenyl, naphthacenyl, benz anthracenyl, anthraquinolyl, fluorenyl, naphthoquinone, and anthraquinone.

Examples of the C$_{4-30}$ heterocycle includes a cyclic group containing 1 to 3 heteroatoms such as oxygen, nitrogen, and sulfur. These heteroatoms may be the same or different. Specific examples include: monocyclic heterocycles such as thienyl, furanyl, pyranyl, pyrrolyl, oxazolyl, thiazolyl, pyridyl, pyrimidyl, and pyrazinyl; and condensed polycyclic heterocycles such as indolyl, benzofuranyl, isobenzofuranyl, benzothienyl, isobenzothienyl, quinolyl, isoquinolyl, quinoxalinyl, quinazolinyl, carbazolyl, acridinyl, phenothiazinyl, phenazinyl, xanthenyl, thianthrenyl, phenoxazinyl, phenoxathiinyl, chromanyl, isochromanyl, dibenzothienyl, xanthonyl, thioxanthonyl, and dibenzofuranyl.

Examples of the C$_{1-30}$ alkyl include: linear alkyl groups (e.g., methyl, ethyl, propyl, butyl, pentyl, octyl, decyl, dodecyl, tetradecyl, hexadecyl, octadecyl); branched alkyl groups (e.g., isopropyl, isobutyl, sec-butyl, tert-butyl, isopentyl, neopentyl, tert-pentyl, isohexyl); cycloalkyl groups (e.g., cyclopropyl, cyclobutyl, cyclopentyl, cyclohexyl); and aralkyl groups benzil, naphthylmethyl, anthracenylmethyl, 1-phenylethyl, 2-phenylethyl). In addition, examples of the C$_{2-30}$ alkenyl include: linear or branched groups (e.g., vinyl, allyl, 1-propenyl, isopropenyl, 1-butenyl, 2-butenyl, 3-butenyl, 1-methyl-1-propenyl, 1-methyl-2-propenyl, 2-methyl-1-propenyl, 2-methyl-2-propenyl, 1-pentenyl, 2-pentenyl, 3-pentenyl, 4-pentenyl, 1-methyl-1-butenyl, 2-methyl-2-butenyl, 3-methyl-2-butenyl, 1,2-dimethyl-1-propenyl, 1-decenyl, 2-decenyl, 8-decenyl, 1-dodecenyl, 2-dodecenyl, 10-dodecenyl); cycloalkenyl groups (e.g., 2-cyclohexenyl, 3-cyclohexenyl); and arylalkenyl groups (e.g., styryl, cinnamyl). Further, examples of the C$_{2-30}$ alkynyl include: liner or branched groups (e.g., ethynyl, 1-propynyl, 2-propynyl, 1-butynyl, 2-butynyl, 3-butynyl, 1-methyl-2-propynyl, 1,1-dimethyl-2-propynyl, 1-pentynyl, 2-pentynyl, 3-pentynyl, 4-pentynyl, 1-decynyl, 2-decynyl, 8-decynyl, 1-dodecynyl, 2-dodecynyl, 10-dodecynyl); and arylalkynyl groups (e.g., phenylethynyl).

The above C$_{6-30}$ aryl, C$_{4-30}$ heterocycle, C$_{1-30}$ alkyl, C$_{2-30}$ alkenyl, or C$_{2-30}$ alkynyl is optionally substituted with at least one substituent. Examples of the substituent include: C$_{1-18}$ linear alkyl (e.g., methyl, ethyl, propyl, butyl, pentyl, octyl, decyl, dodecyl, tetradecyl, hexadecyl, octadecyl); C$_{1-18}$ branched alkyl (e.g., isopropyl, isobutyl, sec-butyl, tert-butyl, isopentyl, neopentyl, tert-pentyl, isohexyl); C$_{3-18}$ cycloalkyl (e.g., cyclopropyl, cyclobutyl, cyclopentyl, cyclohexyl); C$_{1-18}$ linear or branched alkoxy (e.g., hydroxy, methoxy, ethoxy, propoxy, isopropoxy, butoxy, isobutoxy, sec-butoxy, tert-butoxy, hexyloxy, decyloxy, dodecyloxy);

$C_{2-18}$ linear or branched alkylcarbonyl (e.g., acetyl, propionyl, butanoyl, 2-methylpropionyl, heptanoyl, 2-methylbutanoyl, 3-methylbutanoyl, octanoyl, decanoyl, dodecanoyl, octadecanoyl); $C_{7-11}$ arylcarbonyl (e.g., benzoyl, naphthoyl); $C_{2-19}$ linear or branched alkoxycarbonyl (e.g., methoxycarbonyl, ethoxycarbonyl, propoxycarbonyl, isopropoxycarbonyl, butoxycarbonyl, isobutoxycarbonyl, sec-butoxycarbonyl, tert-butoxycarbonyl, octyloxycarbonyl, tetradecyloxycarbonyl, octadecyloxycarbonyl); $C_{7-11}$ aryloxycarbonyl (e.g., phenoxycarbonyl, naphthoxycarbonyl); $C_{7-11}$ arylthiocarbonyl (e.g., phenylthiocarbonyl, naphthoxythiocarbonyl); $C_2$-19 linear or branched acyloxy (e.g., acetoxy, ethylcarbonyloxy, propylcarbonyloxy, isopropylcarbonyloxy, butylcarbonyloxy, isobutylcarbonyloxy, sec-butylcarbonyloxy, tert-butylcarbonyloxy, octylcarbonyloxy, tetradecylcarbonyloxy, octadecylcarbonyloxy); $C_{6-20}$ arylthio (e.g., phenylthio, 2-methylphenylthio, 3-methylphenylthio, 4-methylphenylthio, 2-chlorophenylthio, 3-chlorophenylthio, 4-chlorophenylthio, 2-bromophenylthio, 3-bromophenylthio, 4-bromophenylthio, 2-fluorophenylthio, 3-fluorophenylthio, 4-fluorophenylthio, 2-hydroxyphenylthio, 4-hydroxyphenylthio, 2-methoxyphenylthio, 4-methoxyphenylthio, 1-naphthylthio, 2-naphthylthio, 4-[(phenylthio)benzoyl]phenylthio, 4-[4-(phenylthio)phenoxy]phenylthio, 4-[4[(phenylthio)phenyl]phenylthio, 4-(phenylthio)phenylthio, 4-benzoylphenylthio, 4-benzoyl-2-chlorophenylthio, 4-benzoyl-3-chlorophenylthio, 4-benzoyl-3-methylthiophenylthio, 4-benzoyl-2-methylthiophenylthio, 4-(4-methylthiobenzoyl)phenylthio, 4-(2-methylthiobenzoyl)phenylthio, 4-(p-methylbenzoyl)phenylthio, 4-(p-ethylbenzoyl)phenylthio, 4-(p-isopropylbenzoyl)phenylthio, 4-(p-tert-butylbenzoyl)phenylthio); $C_{1-18}$ linear or branched alkylthio (e.g., methylthio, ethylthio, propylthio, isopropylthio, butylthio, isobutylthio, sec-butylthio, tert-butylthio, pentyltio, isopentylthio, neopentylthio, tert-pentylthio, octylthio, decylthio, dodecylthio); $C_{6-10}$ aryl (e.g., phenyl, tolyl, dimethylphenyl, naphthyl); $C_{4-20}$ heterocycle (e.g., thienyl, furanyl, pyranyl, pyrrolyl, oxazolyl, thiazolyl, pyridyl, pyrimidyl, pyrazinyl, indolyl, benzofuranyl, benzothienyl, quinolyl, isoquinolyl, quinoxalinyl, quinazolinyl, carbazolyl, acridinyl, phenothiazinyl, phenazinyl, xanthenyl, thianthrenyl, phenoxazinyl, phenoxathiinyl, chromanyl, isochromanyl, dibenzothienyl, xanthonyl, thioxanthonyl, dibenzofuranyl); $C_{6-10}$ aryloxy (e.g., phenoxy, naphthyloxy); $C_{1-18}$ linear or branched alkylsulfinyl (e.g., methylsulfinyl, ethylsulfinyl, propylsulfinyl, isopropylsulfinyl, butylsulfinyl, isobutylsulfinyl, sec-butylsulfinyl, tert-butylsulfinyl, pentylsulfinyl, isopentylsulfinyl, neopentylsulfinyl, tert-pentylsulfinyl, octylsulfinyl); $C_{6-10}$ arylsulfinyl (e.g., phenylsulfinyl, tolylsulfinyl, naphthylsulfinyl); $C_{1-18}$ linear or branched alkylsulfonyl (e.g., methylsulfonyl, ethylsulfonyl, propylsulfonyl, isopropylsulfonyl, butylsulfonyl, isobutylsulfonyl, sec-butylsulfonyl, tert-butylsulfonyl, pentylsulfonyl, isopentylsulfonyl, neopentylsulfonyl, tert-pentylsulfonyl, octylsulfonyl); $C_{6-10}$ arylsulfonyl (e.g., phenylsulfonyl, tolylsulfonyl (tosyl), naphthylsulfonyl); alkyleneoxy represented by the following formula (3):

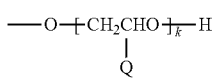

[Chemical Formula 3]

(Q represents hydrogen or methyl; and k is an integer of 1 to 5); unsubstituted amino; amino that is mono-substituted or di-substituted with $C_{1-5}$ alkyl and/or $C_{6-10}$ aryl (specific examples of the $C_{1-5}$ alkyl include: linear alkyl (e.g., methyl, ethyl, propyl, butyl, pentyl); branched alkyl (e.g., isopropyl, isobutyl, sec-butyl, tert-butyl, isopentyl, neopentyl, tert-pentyl); and cycloalkyl (e.g., cyclopropyl, cyclobutyl, cyclopentyl); specific examples of the $C_{6-10}$ aryl include phenyl and naphthyl); cyano; nitro; and halogens (e.g., fluorine, chlorine, bromine, iodine).

In addition, two or more Rs may be directly bonded or may be bonded via —O—, —S—, —SO—, —SO$_2$—, —NH—, (R' is $C_{1-5}$ alkyl or $C_{6-10}$ aryl; specific examples of the $C_{1-5}$ alkyl include; linear alkyl (e.g., methyl, ethyl, propyl, butyl, pentyl); branched alkyl (e.g., isopropyl, isobutyl, sec-butyl, tert-butyl, isopentyl, neopentyl, tert-pentyl); and cycloalkyl (e.g., cyclopropyl, cyclobutyl, cyclopentyl); and specific examples of the $C_{6-10}$ aryl include phenyl and naphthyl), —CO—, —COO—, —CONK—, $C_{1-3}$ alkylene, or phenylene to form a ring structure containing element A. Examples include the following:

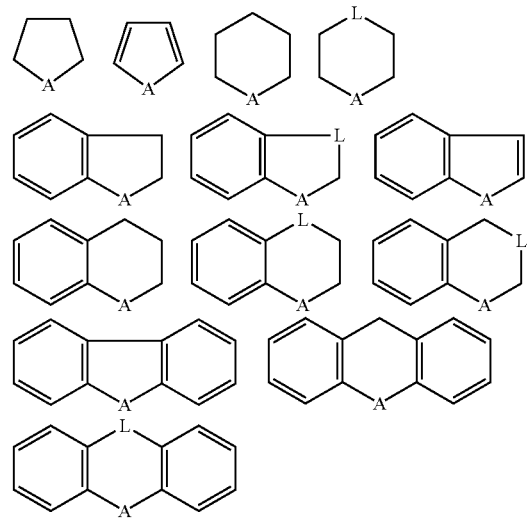

[A is an element of groups VIA to VIIA (CAS nomenclature); L represents —O—, —S—, —SO—, —SO$_2$—, —NH—, —NR'—, —CO—, —COO—, or —CONH—; and R' is the same as described above.]

In formula (1), (m+n(m−1)+1) R bonded to an element A having a valence m of groups VIA to VIIA (CAS nomenclature) may each be the same or different. At least one R or more preferably all the R are $C_{4-30}$ heterocycle or $C_{6-30}$ aryl optionally having the above substituent.

D in formula (1) is represented by a structure represented by the following formula (2):

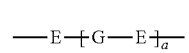

[Chemical Formula 2]

In formula (2), E represents $C_{1-8}$ linear, branched, or cyclic alkylene (e.g., methylene, ethylene, propylene), $C_{6-20}$ arylene (e.g., phenylene, xylylene, naphthylene, biphenylene, anthracenylene), or a $C_{8-20}$ divalent group of a heterocyclic compound (e.g., dibenzofurandiyl, dibenzothiophenediyl, xanthenediyl, phenoxathiindiyl, thianthrenediyl, bithiophenediyl, bifurandiyl, thioxanthonediyl, xanthonediyl, carbazolediyl, acridinediyl, phenothiazinediyl, phenazinediyl). As used herein, the divalent group of the heterocyclic compound refers to a divalent group as obtained by removing one hydrogen atom from each of two different ring carbon atoms of the heterocyclic compound.

The above alkylene, arylene, or divalent group of the heterocyclic compound is optionally substituted with at least one substituent. Specific examples of the substituent include: $C_{1-8}$ linear alkyl (e.g., methyl, ethyl, propyl, butyl, pentyl, octyl); $C_{1-8}$ branched alkyl (e.g., isopropyl, isobutyl, sec-butyl, tert-butyl); $C_{3-8}$ cycloalkyl (e.g., cyclopropyl, cyclohexyl); $C_{1-8}$ alkoxy (e.g., methoxy, ethoxy, propoxy, butoxy, hexyloxy); $C_{6-10}$ aryl (e.g., phenyl, naphthyl); hydroxy; cyano; nitro; and halogens (e.g., fluorine, chlorine, bromine, iodine).

In formula (2), G is —O—, —S—, —SO—, —SO$_2$—, —NH—, —NR'— (R' is the same as described above), —CO—, —COO—, —CONH—, $C_{1-3}$ alkylene, or phenylene. Examples of the $C_{1-3}$ alkylene include linear or branched alkylene (e.g., methylene, ethylene, propylene).

In formula (2), the "a" is an integer of 0 to 5. (a+1) E and (a) G are each the same or different.

Representative examples of "D" represented by formula (2) in formula (1) is described below.

In the case of a=0,

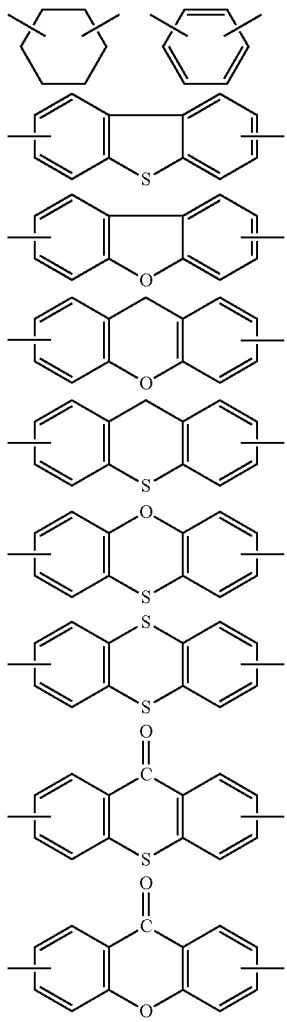

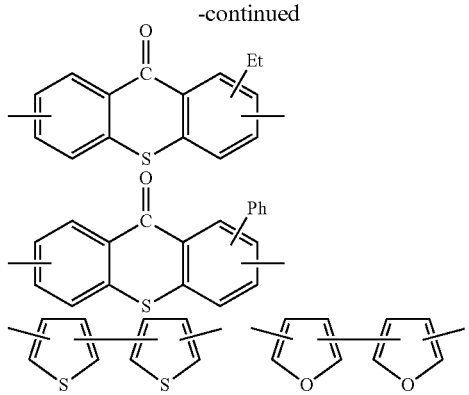

In the case of a=1,

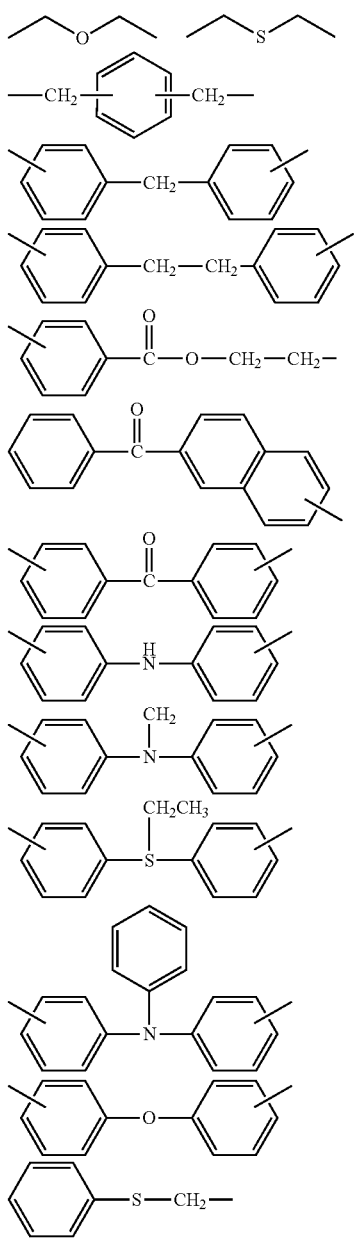

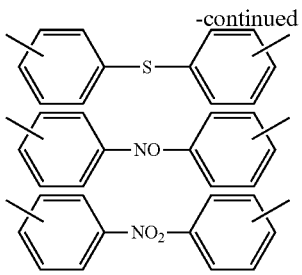

In the case of a=2,

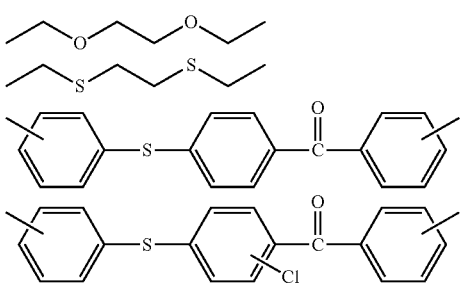

In the case of a=3,

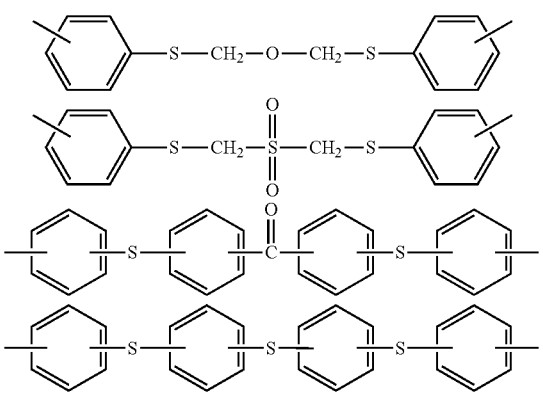

The "n" in formula (1) represents the number of repeating units: [D-A⁺R$_{m-1}$], and is preferably an integer of 0 to 3.

In formula (1): a preferable onium ion [A⁺] is from sulfonium, iodonium, or selenium. Representative examples include the following.

Examples of the sulfonium ion include: triaryl sulfonium (e.g., triphenyl sulfonium, tri-p-tolylsulfonium, tri-o-tolylsulfonium, tris(4-methoxyphenyl)sulfonium, 1-naphthyl diphenyl sulfonium, 2-naphthyl diphenyl sulfonium, tris(4-fluorophenyl)sulfonium, tri-1-naphthylsulfonium, tri-2-naphthylsulfonium, tris(4-hydroxyphenyl)sulfonium, 4-(phenylthio)phenyl diphenyl sulfonium, 4-(p-tolylthio)phenyldi-p-tolylsulfonium, 4-(4-methoxyphenylthio)phenylbis(4-methoxyphenyl)sulfonium, 4-(phenylthio)phenyl-bis(4-fluorophenyl)sulfonium, 4-(phenylthio)phenylbis(4-methoxyphenyl)sulfonium, 4-(phenylthio)phenyldi-p-tolylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, bis{4-[bis(4-methylphenyl)sulfonio]phenyl}sulfide, bis{4-[bis(4-methoxyphenyl)sulfonio]phenyl}sulfide, 4-(4-benzoyl-2-chlorophenylthio)phenylbis(4-fluorophenyl)sulfonium, 4-(4-benzoyl-2-chlorophenylthio)phenyl diphenyl sulfonium, 4-(4-benzoylphenylthio)phenylbis(4-fluorophenyl)sulfonium, 4-(4-benzoylphenylthio)phenyl diphenyl sulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(di-p-tolyl)sulfonio]thioxanthone, 2-[(diphenyl)sulfonio]thioxanthone, 4-[4-(4-tert-butylbenzoyl)phenylthio]phenyldi-p-tolylsulfonium, 4-[4-(4-tert-butylbenzoyl)phenylthio]phenyl diphenyl sulfonium, 4-[4-(benzoylphenylthio)phenyldi-p-tolylsulfonium, 4-[4-(benzoylphenylthio)]phenyl diphenyl sulfonium, 5-(4-methoxyphenyl)thianthrenium, 5-phenylthianthrenium, 5-tolylthianthrenium, 5-(4-ethoxyphenyl)thianthrenium, 5-(2,4,6-trimethylphenyl)thianthrenium); diaryl sulfonium (e.g., diphenylphenacyl sulfonium, diphenyl 4-nitrophenacyl sulfonium, diphenylbenzyl sulfonium, diphenylmethyl sulfonium); monoaryl sulfonium (e.g., phenylmethylbenzylsulfonium, 4-hydroxyphenylmethylbenzylsulfonium, 4-methoxyphenylmethylbenzylsulfonium, 4-acetocarbonyloxyphenylmethylbenzylsulfonium, 2-naphthylmethylbenzylsulfonium, 2-naphthylmethyl(1-ethoxycarbonyl)ethylsulfonium, phenylmethylphenacylsulfonium, 4-hydroxyphenylmethylphenacylsulfonium, 4-methoxyphenylmethylphenacylsulfonium, 4-acetocarbonyloxyphenylmethylphenacylsulfonium, 2-naphthylmethylphenacylsulfonium, 2-naphthyloctadecylphenacylsulfonium, 9-anthracenylmethylphenacylsulfonium); and trialkyl sulfonium (e.g., dimethylphenacylsulfonium, phenacyltetrahydrothiophenium, dimethylbenzylsulfonium, benzyltetrahydrothiophenium, octadecylmethylphenacylsulfonium).

Examples of the iodonium ion include diphenyl iodonium, di-p-tolyliodonium, bis(4-dodecylphenyl)iodonium, bis(4-methoxyphenyl)iodonium, (4-octyloxyphenyl)phenyliodonium, bis(4-decyloxyphenyl)iodonium, 4-(2-hydroxytetradecyloxy)phenylphenyliodonium, 4-isopropylphenyl(p-tolyl)iodonium, and isobutylphenyl(p-tolyl)iodonium.

Examples of the selenium ion include triaryl selenium (e.g., triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphthylselenium, tri-2-naphthylselenium, tris(4-hydroxyphenyl)selenium, 4-(phenylthio)phenyldiphenylselenium, 4-(p-tolylthio)phenyldi-p-tolylselenium); diaryl selenium (e.g., diphenylphenacylselenium, diphenylbenzylselenium, diphenylmethylselenium); monoaryl selenium (e.g., phenylmethylbenzylselenium, 4-hydroxyphenylmethylbenzylselenium, phenylmethylphenacylselenium, 4-hydroxyphenylmethylphenacylselenium, 4-methoxyphenylmethylphenacylselenium); and trialkyl selenium (e.g., dimethylphenacylselenium, phenacyltetrahydroselenophenium, dimethylbenzylselenium, benzyltetrahydroselenophenium, octadecylmethylphenacylselenium).

Among these oniums, preferred is sulfonium or iodonium. Particularly preferred is at least one onium selected from the group consisting of the following sulfonium ions (triphenylsulfonium, tri-p-tolylsulfonium, 4-(phenylthio)phenyl diphenyl sulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenyl bis(4-fluorophenyl)sulfonium, 4-(4-benzoylphenylthio)phenyl diphenyl sulfonium, 7-isopropyl-9-oxo-10-thia-9,10-dihydroanthracene-2-yldi-p-tolylsulfonium, 7-isopropyl-9-oxo-10-thia-9, 10-dihydroanthracene-2-yldiphenylsulfonium, 2-[(di-p- tolyl)sulfonio]thioxanthone, 2-[(diphenyOsulfonio] thioxanthone, 4-[4-(4-tert-butylbenzoyl)phenylthio] phenyldi-p-tolylsulfonium, 4-[4-(benzoylphenylthio)] phenyl diphenyl sulfonium, 5-(4-methoxyphenyl) thianthrenium, 5-phenylthianthrenium, diphenyl phenacyl sulfonium, 4-hydroxyphenyl methylbenzyl sulfonium, 2-naphthylmethyl(1-ethoxycarbonyl)ethylsulfonium, 4-hydroxyphenylmethylphenacylsulfonium, octadecylmethylphenacylsulfonium) and the following iodonium ions (diphenyliodonium, di-p-tolyliodonium, bis(4-dodecylphenyl) iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium).

In formula (1), the "$X^-$" is a counter ion. The number of ions is (n+1) per molecule. Examples of a compound with a counter ion include, but not particularly limited to, methide compounds and halides of a boron compound, a phosphorus compound, an antimony compound, an arsenic compound, or an alkylsulfonate compound. Examples of the ion include: halogen ions (e.g., $F^-$, $Cl^-$, $Br^-$, $I^-$); $OH^-$; $ClO_4^-$; sulfonate ions (e.g., $FSO_3^-$, $ClSO_3^-$, $CH_3SO_3^-$, $C_6H_5SO_3^-$, $CF_3SO_3^-$); sulfate ions (e.g., $HSO_4^-$, $SO_4^{2-}$); carbonate ions (e.g., $HCO_3^-$, $CO_3^{2-}$); phosphate ions (e.g., $H_2PO_4^-$, $HPO_4^{2-}$, $PO_4^{3-}$); fluorophosphate ions (e.g., $PF_6^-$, $PF_5OH^-$, a fluorinated alkylfluorophosphate ion); borate ions ($BF_4^-$, $B(C_6F_5)_4^-$, $B(C_6H_4CF_3)_4^-$); $AlCl_4^-$; and $BiF_6^-$. Other examples include fluoroantimonate ions (e.g., $SbF_6^-$, $SbF_5OH^-$) and fluoroarsenate ions ($AsF_6^-$, $AsF_5OH^-$).

Examples of the fluorinated alkylfluorophosphate ion include a fluorinated alkylfluorophosphate ion represented by the following formula (4), etc.

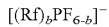

Formula (4)

In formula 4, Rf represents alkyl substituted with fluorine. The b number of Rf is from 1 to 5 and preferably an integer. The (b)Rf are each the same or different. The above b number of Rf is more preferably from 2 to 4 and still more preferably from 2 to 3.

In the fluorinated alkylfluorophosphate ion represented by formula (4), Rf represents alkyl substituted by fluorine. The number of carbon atoms is preferably from 1 to 8 and more preferably from 1 to 4. Examples of the alkyl include: linear alkyl (e.g., methyl, ethyl, propyl, butyl, pentyl, octyl); branched alkyl (e.g., isopropyl, isobutyl, sec-butyl, tert-butyl); and cycloalkyl (e.g., cyclopropyl, cyclobutyl, cyclopentyl, cyclohexyl). Specific examples include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$.

Specific examples of a preferable fluorinated alkylfluorophosphate anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[((CF_3CF_2CF_2CF_2)_3PF_3]^-$.

In order to facilitate dissolution into an epoxy compound and an epoxy resin, the photocationic polymerization initiator that has been dissolved in a solvent(s) may be used. Examples of the solvents include: alcohols (e.g., methanol, ethanol, n-propyl alcohol, isopropyl alcohol, n-butanol, isobutanol); ketones (e.g., acetone, methyl ethyl ketone, methyl isobutyl ketone, methyl n-butyl ketone, methyl n-propyl ketone, cyclopentanone, cyclohexanone); ethers (e.g., diethyl ether, ethyl-tert-butyl ether, tetrahydrofuran, 1,3-dioxane, 1,4-dioxane); carbonates (e.g., propylene carbonate, ethylene carbonate, 1,2-butylene carbonate, dimethyl carbonate, diethyl carbonate); esters (e.g., ethyl acetate, ethyl lactate, butyl cellosolve acetate, carbinol acetate, β-propiolactone, β-butyrolactone, γ-butyrolactone, δ-valerolactone, ε-caprolactone); monoalkyl glycol ethers (e.g., ethylene glycol monomethyl ether, ethylene glycol monoethyl ether, propyleneglycol monomethyl ether, propyleneglycol monoethyl ether, diethylene glycol monomethyl ether, diethylene glycol monoethyl ether, dipropylene glycol monomethyl ether, dipropylene glycol monoethyl ether, triethylene glycol monomethyl ether, triethylene glycol monoethyl ether, tripropylene glycol monomethyl ether, tripropylene glycol monoethyl ether); dialkyl glycol ethers (e.g., ethylene glycol dimethyl ether, ethylene glycol diethyl ether, propylene glycol dimethyl ether, propylene glycol diethyl ether, diethylene glycol dimethyl ether, diethylene glycol diethyl ether, dipropylene glycol dimethyl ether, dipropylene glycol diethyl ether, triethylene glycol dimethyl ether, triethylene glycol diethyl ether, tripropylene glycol dimethyl ether, tripropylene glycol diethyl ether); aliphatic carboxylates of monoalkyl glycol ether (e.g., ethylene glycol monomethyl ether acetate, ethylene glycol monoethyl ether acetate, propylene glycol monomethyl ether acetate, propylene glycol monoethyl ether acetate); aromatic hydrocarbons (e.g., toluene, xylene, tetramethyl benzene); aliphatic hydrocarbons (e.g., hexane, octane, decane); petroleum-based solvents (e.g., petroleum ether, petroleum naphtha, hydrogenated petroleum naphtha, solvent naphtha); and nitriles (e.g., acetonitrile).

One or more of these photocationic polymerization initiators may be selectively used.

Examples of an anion species of the photocationic polymerization initiator include halides of a boron compound, phosphorus compound, antimony compound, arsenic compound, or alkylsulfonate compound. One or more of these anion species may be selectively used. Among them, fluoride is preferable in view of excellent photocuring performance and increased adhesiveness and adhesive durability. Among the fluorides, preferred is hexafluoroantimonate.

A usage amount of the photocationic polymerization initiator (C) is preferably from 0.01 to 5 parts by mass and more preferably from 0.05 to 3 parts by mass when the components (A) and (B) have a total of 100 parts by mass. When the usage amount of the photocationic polymerization initiator is 0.01 part by mass or more, the photocuring performance is not poor. When the usage amount is 5 parts by mass or less, the adhesive durability is not decreased.

((D) Photosensitizer)

The resin composition according to this embodiment contains (D) a photosensitizer. The term "photosensitizer" refers to a compound that absorbs energy beams to efficiently generate cations from a photocationic polymerization initiator.

Examples of the photosensitizer include, but are not particularly limited to, a benzophenone derivative, phenothiazine derivative, phenylketone derivative, naphthalene derivative, anthracene derivative, phenanthrene derivative, naphthacene derivative, chrysene derivative, perylene derivative, pentacene derivative, acridine derivative, benzothiazole derivative, benzoin derivative, fluorene derivative, naphthoquinone derivative, anthraquinone derivative, xanthene derivative, xanthone derivative, thioxanthene derivative, thioxanthone derivative, coumarin derivative, ketocoumarin derivative, cyanine derivative, azine derivative, thiazine derivative, oxazine derivative, indoline derivative, azulene derivative, triallylmethane derivative, phthalocyanine derivative, spiropyran derivative, spirooxazine derivative, thiospiropyran derivative, and organic ruthenium complex. Among them, preferred are a phenylketon derivative such as 2-hydroxy-2-methyl-1-phenyl-propane-1-one and/or an anthracene derivative such as 9,10-dibutoxyanthracene. More preferred is the phenylketon derivative. Most preferred is 2-hydroxy-2-methyl-1-phenylpropane-1-one.

From the viewpoints that neither the curing performance is deteriorated nor the storage stability is decreased, a usage amount of the photosensitizer (D) per 100 parts by mass of a total of the components (A) and (B) is preferably from 0.1 to 10 parts by mass, more preferably 0.5 to 5 parts by mass, and still more preferably from 1 to 3 parts by mass.

((E) Stabilizer)

The resin composition according to this embodiment may contain (E) a stabilizer. Including the stabilizer makes the resin composition according to this embodiment exhibit excellent storage stability.

Examples of the stabilizer include, but are not particularly limited to, an antioxidant, an ether compound, and a mixture thereof. Among them, preferred is an ether compound. Examples include polyethylene glycol, polypropylene glycol, polyalkylene oxide (e.g., polyoxytetramethylene glycol), and a cyclic crown ether. Among them, preferably used is a crown ether.

Among the above stabilizers, more preferably used is a crown ether. Use of the crown ether makes it possible to achieve excellent curing performance suitable for manufacturing an organic EL display in view of its additive amount.

The polyalkylene oxide may be used as the above stabilizer. In this case, a terminal of the above polyalkylene oxide is not particularly limited. The terminal may be a hydroxy group, may be etherified or esterified using another compound, or may be a functional group such as an epoxy group. Among them, a hydroxyl group or an epoxy group is suitable because they can react with the above photopolymerizable compound.

Further, a polyalkylene oxide-addition bisphenol derivative is preferably used as the above polyalkylene oxide. The compound with a terminal hydroxy or epoxy group, in particular, is more preferably used.

The above stabilizer preferably has two or more polyethylene glycol and/or polypropylene glycol moieties per molecule.

Among the above stabilizers, examples of a commercially available stabilizer having two or more polyethylene glycol moieties per molecule include "RIKARESIN BEO-60E" and "RIKARESIN EO-20" (both manufactured by New Japan Chemical Co., Ltd.).

In addition, examples of a commercially available stabilizer having two or more polypropylene glycol moieties per molecule include "RIKARESIN BPO-20E" and "RIKARESIN PO-20" (both manufactured by New Japan Chemical Co., Ltd.).

Examples of the above crown ether include, but are not particularly limited to, 12-crown-4, 15-crown-5, 18-crown-6, and dicyclohexano-18-crown-6.

Including the stabilizer makes it possible to not only increase storage stability, but also adjust a curing rate. This enables a photocurable resin composition to be cured when a certain time has passed after light irradiation.

A usage amount of the stabilizer is preferably from 0.05 to 20 parts by mass and more preferably from 0.1 to 10 parts by mass when the components (A) and (B) have a total of 100 parts by mass. When the usage amount is 0.05 part by mass or more, the storage stability increases. When the usage amount is 20 parts by mass or less, the curing performance is not decreased.

((F) Silane Coupling Agent)

The resin composition according to this embodiment may contain (F) a silane coupling agent. Including the silane coupling agent makes the resin composition according to this embodiment exhibit excellent adhesiveness and adhesive durability.

Examples of the silane coupling agent include, but are not particularly limited to, γ-chloropropyl trimethoxysilane, vinyl trimethoxysilane, vinyl trichlorosilane, vinyl triethoxysilane, vinyl-tris(β-methoxyethoxy)silane, γ-methacryloxypropyl trimethoxysilane, γ-acryloxypropyl trimethoxysilane, β-(3,4-epoxycyclohexyl)ethyl trimethoxysilane, γ-glycidoxypropyl trimethoxysilane, γ-glycidoxypropyl triethoxysilane, γ-mercaptopropyl trimethoxysilane, γ-aminopropyl triethoxysilane, N-β-(aminoethyl)-γ-aminopropyl trimethoxysilane, N-β-(aminoethyl)-γ-aminopropylmethyl dimethoxysilane, and γ-ureidopropyl triethoxysilane. One or more of these silane coupling agents may be selectively used. Among them, preferred is one or more selected from the group consisting of β-(3,4-epoxycyclohexyl)ethyl trimethoxysilane, γ-glycidoxypropyl trimethoxysilane, γ-glycidoxypropyl triethoxysilane, γ-methacryloxypropyl trimethoxysilane, and γ-acryloxypropyl trimethoxysilane.

In view of excellent adhesiveness and adhesive durability, a usage amount of the silane coupling agent is preferably from 0.1 to 10 parts by mass and more preferably from 0.5 to 5 parts by mass when the components (A) and (B) have a total of 100 parts by mass.

The resin composition according to this embodiment may contain another cationic polymerizable compound such as an aliphatic epoxy compound, an oxetane compound, and a vinyl ether compound.

An additive may be used for the resin composition according to this embodiment. Examples of the additive include: various elastomers (e.g., acryl rubber, urethane rubber); graft copolymers (e.g., a methyl methacrylate-butadiene-styrene-based graft copolymer, acrylonitrile-butadiene-styrene-based graft copolymer); an inorganic filler; a solvent; an extender; a reinforcing agent; a plasticizer; a thickener; a dye; a pigment; a fire retardant; and a surfactant.

((G) Microparticles)

The resin composition according to this embodiment may further contain microparticles. The microparticles are not particularly limited, but inorganic or organic transparent microparticles may be used.

Examples of the inorganic microparticles include: silica particles; glass fillers; spherical alumina; crushed alumina; oxides (e.g., magnesium oxide, beryllium oxide, titanium oxide, zirconia, zinc oxide); nitrides (e.g., boron nitride, silicon nitride, aluminum nitride); carbides (e.g., silicon carbide); hydroxides (e.g., aluminum hydroxide, magnesium hydroxide); metals (e.g., copper, silver, iron, aluminum, nickel, titanium) and alloys thereof; carbon (e.g., diamond, carbon)-based fillers; calcium carbonate; barium sulfate; talc; and mica. They may be subjected to surface treatment using, for example, fatty acid, a silicone coupling agent, or a titanate-based coupling agent, etc. In addition, examples of the organic microparticles include crosslinked styrene-based particles, crosslinked acrylic particles, fluorine-modified crosslinked acrylic particles, crosslinked styrene-acryl-based particles, and crosslinked silicone-based particles. The 50% particle size is within a range preferably from 0.001 to 30 μm. This range causes the particle size to be neither too small to facilitate aggregation nor too big to facilitate precipitation. In addition, two or more kinds of the microparticles may be used depending on the need.

As used herein, the term "50% particle size" refers to a particle size when the cumulative volume frequency is 50%.

Examples of a device used in a method for determining a particle size include, but are not particularly limited to, a laser diffraction particle size distribution meter, a laser Doppler particle size distribution meter, a dynamic light-scattering particle size distribution meter, and an ultrasonic particle size distribution meter.

A usage amount of the microparticles is preferably from 0.01 to 20 parts by mass and more preferably from 0.1 to 10 parts by mass when the components (A) and (B) have a total of 100 parts by mass.

(Moisture Content)

In view of preventing deterioration of an organic EL element, the resin composition according to this embodiment has a moisture content of preferably 1000 ppm or less, more preferably 500 ppm or less, and still more preferably 100 ppm or less. When this moisture content exceeds 1000 ppm, it is unlikely to prevent the moisture content included in the resin composition from being in contact with the organic EL element. This results in the deterioration of the organic EL element. Still more this moisture content may be equal to or less than any of 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, and 1500 ppm.

(Chlorine Content)

In view of preventing deterioration of an organic EL element, the resin composition according to this embodiment has a chlorine content of preferably 1000 ppm or less, more preferably 800 ppm or less, still more preferably 700 ppm or less, and still more preferably less than 100 ppm. When this chlorine content exceeds 1000 ppm, it is unlikely to prevent the chlorine content included in the resin composition from being in contact with the organic EL element. This results in the deterioration of the organic EL element. Still more this chlorine content may be equal to or less than any of 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, and 1500 ppm.

(Viscosity)

In order to achieve excellent coating properties, the resin composition according to this embodiment may have a shear viscosity of 5 mPa·s or higher. This case is preferable because the adhesive is not subjected to wetting more than necessary. The shear viscosity may be 2000 mPa·s or lower. This case is preferable because the resin composition can be precisely coated using a commercially available coater such as a dispenser. More preferably, the shear viscosity is 1000 mPa·s or lower. Still more this viscosity may be between any two of the values including 5 mPa·s, 10 mPa·s, 25 mPa·s, 50 mPa·s, 75 mPa·s, 100 mPa·s, 250 mPa·s, 500 mPa·s, 750 mPa·s, 1000 mPa·s, 2500 mPa·s, 5000 mPa·s, and 7000 mPa·s.

Embodiment 2: Cured Product

A cured product may be produced by curing, using energy beam irradiation, a resin composition according to an embodiment of the present invention. At that time, in this embodiment, the resin composition may be cured by energy beam irradiation using the following light sources.

[Light Source]

Examples of a light source used for curing and/or bonding of the resin composition according to this embodiment include, but are not particularly limited to, a halogen lamp, a metal-halide lamp, a high-power metal-halide lamp (including, for example, indium), a low-pressure mercury lamp, a high-pressure mercury lamp, a ultrahigh-pressure mercury lamp, a xenon lamp, a xenon excimer lamp, a xenon flash lamp, and a light-emitting diode (hereinafter, referred to as "LED"). These light sources are preferable because a target is efficiently irradiated with energy beams corresponding to a reaction wavelength for each photopolymerization initiator.

The above light sources each have different irradiation wavelengths and/or energy distributions. Because of this, the above light sources are appropriately selected depending on, for example, the reaction wavelength for each photopolymerization initiator. In addition, natural light (sunlight) may be a reaction initiation light source.

With regard to the irradiation using the above light source, direct irradiation and/or focused irradiation using, for example, a reflector or fibers may be performed. For example, a low-wavelength cutting filter, a heat-ray cutting filter, and/or a cold mirror may be used.

The resin composition according to this embodiment may be subjected to heat treatment after light irradiation so as to increase a curing rate. When an organic EL element is sealed, the temperature of the heat treatment after the light irradiation is preferably 120° C. or lower and more preferably 80° C. or lower in view of imparting no damage to the organic EL element.

Embodiment 3: Adhesive

A resin composition according to an embodiment of the present invention may be used as an adhesive. The adhesive according to this embodiment can be suitably used for attachment to, for example, a package for an organic EL element.

Embodiment 4: Process for Producing Resin Composition

A process for producing a resin composition according to an embodiment of the present invention is not particularly limited as long as the above components are well mixed. Examples of a method for mixing each component include, but are not particularly limited to, a mixing method utilizing stirring force caused by propeller rotation and a method utilizing a regular disperser such as a planetary mixer that is subject to rotation and revolution. These mixing methods are preferable in view of providing stable mixing at low cost.

[Method for Decreasing Moisture Content]

The process for producing a resin composition according to this embodiment preferably includes a step of decreasing moisture content. Examples of the method for decreasing moisture content include, but are not particularly limited to, the following methods.

(1) Removing Moisture Content by Using Desiccant. After moisture content is removed, a desiccant is separated by decantation or filtration. The desiccant is not particularly limited as long as the desiccant has no influence on the resin composition. Examples of the desiccant include: polymer absorbers (e.g., a molecular sieve, synthetic zeolite, alumina, silica gel); inorganic salts (e.g., calcium chloride, anhydrous magnesium sulfate, quick lime, anhydrous sodium sulfate, anhydrous calcium sulfate); and alkali solids (e.g., sodium hydroxide, potassium hydroxide).

(2) Removing Moisture Content by Heating under Reduced Pressure Condition.

(3) Distillation and refinement under Reduced Pressure Condition.

(4) Removing Moisture Content by Introducing Inert Gas (e.g., Dried Nitrogen or Dried Argon Gas) into Each Component.

(5) Removing Moisture Content by Lyophilization.

As to the method for decreasing moisture content, moisture content of each component may be decreased before mixing or moisture content may be decreased after mixing of each component. One or more of the step of decreasing moisture content may be combined. In order to avoid moisture content contamination after the step of decreasing moisture content, the process is preferably carried out under an inert gas atmosphere.

[Method for Decreasing Chlorine Content]

The process for producing a resin composition according to this embodiment preferably includes a step of decreasing chlorine content. Examples of the method for decreasing chlorine content include, but are not particularly limited to, the following methods.

Generally speaking, an epoxy resin can be produced by reacting a polyhydric alcohol compound with epichlorohydrin. During this production process, chlorine impurities due to epichlorohydrin are generated. Examples of a method for decreasing these chlorine impurities include, but are not particularly limited to, a purification procedure such as distillation. In addition, this reaction is carried out using alcohols (JP-A-54-13596), an ether compound such as dioxane (JP-A-58-189223), dimethylsulfoxide (DMSO) (JP-A-63-254121), or other non-protonic polar solvents with high boiling points. In each process, a polyhydric alcohol compound and epichlorohydrin are reacted under highly alkaline conditions (e.g., the reaction is carried out under the presence of alkali metal hydroxide). By doing so, generation of chlorine impurities may be decreased.

Embodiment 5: Method for Manufacturing Organic EL Display

A method for manufacturing an organic EL display by using a curable resin composition according to an embodiment of the present invention includes: for example, applying the resin composition according to this embodiment onto a first substrate (a backboard); irradiating the resin composition with light for activation, and thereafter; blocking the light; attaching the backboard via the composition onto a second substrate having thereon an EL element; and performing sealing without exposing the organic EL element to light and heat.

In addition, the resin composition according to this embodiment is used to apply it onto a first substrate. A second substrate is attached via the resin composition to the first substrate. Then, the resin composition according to this embodiment is irradiated with light. This method may be used to manufacture an organic EL display.

Specifically, the method for manufacturing an organic EL display according to this embodiment includes: applying the above stabilizer-containing sealant for an organic EL element according to this embodiment onto a whole surface or part of a moistureproof substrate, and thereafter; irradiating the substrate with light; and attaching and sealing the moistureproof substrate onto the organic EL element while the resin compounds is cured.

In the method for manufacturing an organic EL element according to this embodiment, it is preferable to perform heating after the moistureproof substrate is attached to the organic EL element. If the heating is carried out after the above moistureproof substrate is attached to the organic EL element, it is possible to increase a curing rate of the resin composition.

Examples

Hereinafter, the present invention is further described in detail by referring to Examples and Comparative Examples. However, the above embodiments are not limited to these Examples. Unless otherwise indicated, tests were carried out at 23° C. and a relative humidity of 50% by mass.

The following compounds were used for Examples and Comparative Examples.

The following compounds were used as epoxy compounds of the component (A).

(A-1) 3,4-epoxycyclohexenylmethyl-3,4-epoxycyclohexene carboxylate ("CELLOXIDE 2021P", manufactured by Daicel Corporation); and (A-2) 3,4-Epoxycyclohexylmethyl methacrylate ("CYCLOMER M100", manufactured by Daicel Corporation).

The following compounds were used as epoxy resins of the component (B).

(B-1) Epoxidized polybutadiene resin ("JP-200", manufactured by NIPPON SODA CO., LTD., with a molecular weight of 2000 to 2600);

(B-2) 1,2-Epoxy-4-(2-oxiranyl)cyclohexane addition product of 2,2-bis(hydroxymethyl)-1-butanol ("CELLOXIDE EHPE3150", manufactured by Daicel Corporation, with a molecular weight of 340 to 380);

(B-3) Dicyclopentadiene-based epoxy compound ("EP-4088S", manufactured by ADEKA, Inc., with a molecular weight of 300 to 340);

(B-4) Bisphenol A-type epoxy resin ("jER828", manufactured by Mitsui Chemicals, Inc., with a molecular weight of 360 to 390);

(B-5) Bisphenol F-type epoxy resin ("jER806", manufactured by Mitsui Chemicals, Inc., with a molecular weight of 320 to 340);

(B-6) Bisphenol F-type epoxy resin ("YL983U", manufactured by Mitsui Chemicals, Inc., with a molecular weight of 360 to 380);

(B-7) Hydrogenated bisphenol A-type epoxy resin ("YX8000", manufactured by Mitsui Chemicals, Inc., with a molecular weight of 380 to 430); and (B-8) Bisphenol F-type epoxy resin ("KRM-2490", manufactured by ADEKA, Inc., with a molecular weight of 340 to 380).

The following compounds were used as photocationic polymerization initiators of the component (C).

(C-1) Triarylsulfonium salt hexafluoroantimonate ("Adeka Optomer SP-170", manufactured by ADEKA, Inc.; the anion species is hexafluoroantimonate); and (C-2) Triarylsulfonium salt ("CPI-200K", manufactured by San-Apro Ltd.; the anion species is a phosphorus compound).

The following compounds were used as photosensitizers of the component (D).

(D-1) 2-Hydroxy-2-methyl-1-phenyl-propane-1-one ("DAROCUR 1173", manufactured by BASF, Inc.; and (D-2) 9,10-Dibutoxyanthracene ("ANTHRACURE UVS-1331", manufacture by Kawasaki Kasei Chemicals).

The following compounds were used as stabilizers of the component (E).(E-1) 18-Crown-6-ether ("Crown ether O-18", manufactured by NIPPON SODA CO., LTD.);

(E-2) 15-Crown-5-ether ("Crown ether O-15", manufactured by NIPPON SODA CO., LTD.); and (E-3) Dicyclohexano-18-crown-6-ether (manufactured by TOKYO CHEMICAL INDUSTRY CO., LTD.)

The following compound was used as silane coupling agents of the component (F).

(F-1) γ-Glycidoxypropyl trimethoxysilane ("KBM-403", manufactured by Shin-Etsu Chemical Co., Ltd.);

(F-2) γ-Glycidoxypropyl triethoxysilane ("KBE-403", manufactured by Shin-Etsu Chemical Co., Ltd.); and (F-3) 3-methacryloxypropyl trimethoxysilane ("A-174", manufactured by Momentive Performance Materials Inc.).

The following compounds were used as microparticles of the component (E).

(G-1) Silica ("SFP-30M", manufactured by DENKI KAGAKU KOGYO KABUSHIKI KAISHA);

(G-2) Silica whose surface is treated with a coupling agent ("SFP-30MHE", manufactured by DENKI KAGAKU KOGYO KABUSHIKI KAISHA);

(G-3) Silica whose surface is subjected to hydrophobic treatment ("R-974", manufactured by Aerosil Inc.); and (G-4) Alumina ("ASFP-30", manufactured by DENKI KAGAKU KOGYO KABUSHIKI KAISHA).

Raw materials designated in Tables 1 to 4 were mixed at composition ratios designated in Tables 1 to 4 to prepare resin compositions according to Examples and Comparative Examples. The unit of each composition ratio is parts by mass.

In Examples and Comparative Examples, the following step of removing moisture content was carried out depending on the need.

After each component was sufficiently mixed, 15 parts by mass of molecular sieve 3A were added under an inert gas (nitrogen gas) atmosphere to 100 parts by mass of the resin composition. Next, the mixture was stirred for 5 to 70 hours under conditions at a mixing rate of 50 to 200 rpm. Then, the resin composition after the stirring was filtered to obtain a resin composition with a moisture content designated in Table 1. The molecular sieve was heated for 2 hours or more at 200° C. or higher, cooled, stored in a silica gel-containing desiccator, and then used. In Examples and Comparative Examples, a step of removing chlorine content (e.g., distillation) was carried out depending on the need.

The resin compositions according to Examples and Comparative Examples were each subjected to the following measurements. Tables 1 and 4 show the results.

[Viscosity]

An E-type viscometer was used to measure a viscosity (shear viscosity) of the composition under conditions at a temperature of 25° C. and a rotating speed of 10 rpm.

[Moisture Content]

A Karl Fischer moisture meter was used to measure the moisture content of the resin composition.

[Chlorine Content]

The chlorine content of the resin composition was determined as follows. About 30 mg of a sample and 10 mL of hydrogen peroxide water (with a concentration of 0.5%) were weighed and placed in a combustion flask. The mixture was heated and then subjected to shaking. Then, ultrapure water was added to adjust its volume to 100 mL. After that, an ion chromatography analyzer (manufactured by DIONEX, Inc.) was used to perform quantitative chlorine analysis and to determine chlorine content.

[Photocuring Conditions]

The curing performance and adhesiveness of the resin composition were evaluated. At that time, the following light irradiation conditions were used to cure the resin composition. An electrodeless discharge metal halide lamp-equipped UV curing device (manufactured by Fusion Curing Systems Inc.) was used to cure the resin composition under conditions at a wavelength of 365 nm and an accumulated amount of light of 4,000 mJ/cm$^2$. Then, the resin composition is further heated in an oven at 80° C. for 30 min to yield a cured product.

[Moisture Permeation Rate]

A cured product sheet with a thickness of 0.1 mm was prepared under the above photocuring conditions. In accordance with JIS Z0208 "a test (dish method) for a moisture permeation rate of a moistureproof packaging material", (anhydrous) calcium chloride was used as a desiccant. Then, the moisture permeation rate was determined at an atmospheric temperature of 60° C. and a relative humidity of 90%. Preferably, the moisture permeation rate is 120 g/(m$^2$·24 hr) or less.

[Tensile Shear Bond Strength]

First, two borosilicate glass test pieces (length 25 mm×width 25 mm×thickness 2.0 mm; Tempax® glass) were used. Next, the resin composition was cured at an adhesion area of 0.5 cm$^2$ and an adhesion thickness of 80 μm under the above photocuring conditions. After the curing, the test pieces attached using an adhesive containing this resin composition were used to measure a tensile shear bond strength (unit: MPa) under an atmosphere at a temperature of 23° C. and a relative humidity of 50% and at a tension rate of 10 mm/min.

[Adhesive Durability (PCT)]

First, two borosilicate glass test pieces (length 25 mm×width 25 mm×thickness 2.0 mm; Tempax® glass) were used. Next, the resin composition is cured at an adhesion area of 0.5 cm$^2$ and an adhesion thickness of 80 μm under the above photocuring conditions. After the curing, the test pieces attached using an adhesive containing this resin composition were exposed for 10 hours in a pressure cooker test (hereinafter, referred to as PCT) at 121° C. and a relative humidity of 100% by mass and under an atmosphere at 2 atm. The post-exposure test pieces were used to measure a tensile shear bond strength (unit: MPa) under an atmosphere at a temperature of 23° C. and a relative humidity of 50% and at a tension rate of 10 mm/min. Then, the adhesion retention was calculated using the following equation (equation 1). The adhesion retention is preferably 25% or higher and more preferably 50% or higher.

$$\text{Adhesion retention (\%)} = (\text{Tensile shear bond strength after PCT})/(\text{Initial tensile shear bond strength}) \times 100. \quad \text{(Equation 1)}$$

[Evaluation of Organic EL]

[Manufacture of Organic EL Element Substrate]

A glass substrate with an ITO electrode was washed with each of acetone and isopropanol. Then, a vacuum vapor deposition process was used to subject the following compounds to vapor deposition one by one to form thin films. Finally, an organic EL element substrate was produced.

Copper phthalocyanine;
N,N'-diphenyl-N,N'-dinaphthylbenzidine (α-NPD);
Tris(8-hydroxyquinolinato)aluminum;
Lithium fluoride; and
Aluminum.

[Manufacture of Organic EL Element]

The resin compositions according to Examples and Comparative Examples were each applied onto a glass piece by using a coating device under a nitrogen atmosphere. This glass piece was attached to the organic EL element substrate. Next, an adhesive containing this resin composition at an adhesion thickness of 10 μm was cured under the above photocuring conditions. Then, an organic EL element was manufactured (for organic EL evaluation).

[Initial State]

The just manufactured organic EL element was exposed for 1000 hours under conditions at 85° C. and a relative humidity of 85% by mass. Next, a voltage of 6V was applied. Then, the light emission state of the organic EL element was visually inspected and observed under a microscope. By doing so, the diameter of each dark spot was determined.

[Durability]

The just manufactured organic EL element was exposed for 1000 hours under conditions at 85° C. and a relative humidity of 85% by mass. Next, a voltage of 6V was applied. Then, the light emission state of the organic EL element was visually inspected and observed under a microscope. By doing so, the diameter of each dark spot was determined.

The diameter of each dark spot is preferably 300 μm or smaller and more preferably 50 μm or smaller. It is most preferable that there is no dark spot.

[Storage Stability Test]

First, the initial viscosity (V0) of the composition was measured. Next, the viscosity (V4) of the composition was measured after 4 weeks of an accelerated test in which the composition is kept in a container with a lid (a closed system) under a high-temperature condition at about 40° C. Then, a viscosity change was calculated using the formula: V4/V0. When the viscosity change is 2 or less, the storage stability was determined to be good.

TABLE 1

| | Component [parts by mass] | | Example 1 | Example 2 | Example 3 | Example 4 | Example 5 | Example 6 | Example 7 | Example 8 | Example 9 |
|---|---|---|---|---|---|---|---|---|---|---|---|
| (A) | (A-1) | CELLOXIDE 2021P | 50 | 75 | 95 | 75 | 75 | 75 | 75 | 75 | 75 |
| | (A-2) | CYCLOMER M100 | | | | | | | | | |
| (B) | (B-1) | JP-200 | 50 | 25 | 5 | | | | | | |
| | (B-2) | EHPE3150 | | | | 25 | | | | | |
| | (B-3) | EP-4088S | | | | | 25 | | | | |
| | (B-4) | jER 828 | | | | | | 25 | | | |
| | (B-5) | jER 806 | | | | | | | 25 | | |
| | (B-6) | YL983U | | | | | | | | 25 | |
| | (B-7) | YX-8000 | | | | | | | | | 25 |
| | (B-8) | KRM-2490 | | | | | | | | | |
| (C) | (C-1) | Adeka Optomer SP-170 | 1 | 1 | 1 | 1 | 1 | 1 | 1 | 1 | 1 |
| | (C-2) | CPI-200K | | | | | | | | | |
| (D) | (D-1) | DAROCUR 1173 | 2 | 2 | 2 | 2 | 2 | 2 | 2 | 2 | 2 |
| | (D-2) | ANTHRACURE UVS-1331 | | | | | | | | | |
| (E) | (E-1) | Crown ether O-18 | | | | | | | | | |
| | (E-2) | Crown ether O-15 | | | | | | | | | |
| | (E-3) | Dicyclohexano-18-crown-6-ether | | | | | | | | | |
| (F) | (F-1) | KBM-403 | 3 | 3 | 3 | 3 | 3 | 3 | 3 | 3 | 3 |
| | (F-2) | KBE-403 | | | | | | | | | |
| | (F-3) | A-174 | | | | | | | | | |
| (G) | (G-1) | SFP-30M | | | | | | | | | |
| | (G-2) | SFP-30MHE | | | | | | | | | |
| | (G-3) | R-974 | | | | | | | | | |
| | (G-4) | ASFP-30 | | | | | | | | | |
| Moisture Content | ppm | | 100 | 100 | 100 | 700 | 400 | 100 | 100 | 800 | 100 |
| Chlorine Content | ppm | | <100 | <100 | <100 | <100 | 750 | 550 | 550 | 120 | 500 |
| Viscosity [mPa · s] at 25° C. | | | 7,000 | 850 | 250 | 900 | 200 | 510 | 250 | 300 | 250 |
| Moisture Permeation Rate [g/(m2 · 24 hr)] | 60° C., 90% RH | | 42 | 50 | 65 | 65 | 45 | 75 | 70 | 73 | 66 |
| Tensile Shear Bond Strength | Mpa | | 23 | 22 | 22 | 25 | 28 | 27 | 30 | 20 | 24 |
| Adhesive Durability (PCT) [%] | 121° C., 100% RH, 2 atm, After 10 h | | 70 | 70 | 75 | 80 | 85 | 80 | 80 | 85 | 90 |
| Organic EL Evaluation [μm] | Initial State | | 0 | 0 | 0 | 0 | 0 | 0 | 0 | 0 | 0 |
| | Durability (85° C. 85% RH) After 1000 h | | 0 | 0 | 0 | 30 | 10 | 0 | 0 | 55 | 20 |
| Storage Stability Evaluation | 40° C., After 4 weeks Viscosity Change (V4/V0) | | 2.1 | 2.2 | 2.4 | 1.7 | 1.6 | 1.1 | 1.1 | 1.7 | 1.3 |

TABLE 2

| | Component [parts by mass] | | Example 10 | Example 11 | Example 12 | Example 13 |
|---|---|---|---|---|---|---|
| (A) | (A-1) | CELLOXIDE 2021P | 95 | 95 | 95 | 95 |
| | (A-2) | CYCLOMER M100 | | | | |
| (B) | (B-1) | JP-200 | 5 | 5 | 5 | 5 |
| | (B-2) | EHPE3150 | | | | |
| | (B-3) | EP-4088S | | | | |
| | (B-4) | jER 828 | | | | |
| | (B-5) | jER 806 | | | | |
| | (B-6) | YL983U | | | | |
| | (B-7) | YX-8000 | | | | |
| | (B-8) | KRM-2490 | | | | |
| (C) | (C-1) | Adeka Optomer SP-170 | 0.5 | 0.5 | 0.5 | 0.5 |
| | (C-2) | CPI-200K | | | | |
| (D) | (D-1) | DAROCUR 1173 | | | | |
| | (D-2) | ANTHRACURE UVS-1331 | | | | |
| (E) | (E-1) | Crown ether O-18 | | 1 | | |
| | (E-2) | Crown ether O-15 | | | 1 | |
| | (E-3) | Dicyclohexano-18-crown-6-ether | | | | 1 |
| (F) | (F-1) | KBM-403 | 3 | 3 | 3 | 3 |
| | (F-2) | KBE-403 | | | | |
| | (F-3) | A-174 | | | | |
| (G) | (G-1) | SFP-30M | | | | |
| | (G-2) | SFP-30MHE | | | | |
| | (G-3) | R-974 | | | | |
| | (G-4) | ASFP-30 | | | | |
| Moisture Content | ppm | | 100 | 100 | 100 | 100 |
| Chlorine Content | ppm | | <100 | <100 | <100 | <100 |
| Viscosity [mPa·s] at 25° C. | | | 250 | 250 | 250 | 250 |
| Moisture Permeation Rate [g/(m2·24 hr)] | 60° C., 90% RH | | 70 | 63 | 65 | 66 |
| Tensile Shear Bond Strength | Mpa | | 22 | 22 | 21 | 21 |
| Adhesive Durability (PCT) [%] | 121° C., 100% RH, 2 atm, After 10 h | | 78 | 80 | 78 | 78 |
| Organic EL Evaluation [μm] | Initial State | | 0 | 0 | 0 | 0 |
| | Durability (85° C. 85% RH) After 1000 h | | 280 | 100 | 120 | 120 |
| Storage Stability Evaluation | 40° C., After 4 weeks Viscosity Change (V4/V0) | | 2.1 | 1.1 | 1.1 | 1.1 |

TABLE 3

| | Component [parts by mass] | | Example 14 | Example 15 | Example 16 | Example 17 | Example 18 |
|---|---|---|---|---|---|---|---|
| (A) | (A-1) | CELLOXIDE 2021P | 75 | 75 | 75 | 75 | |
| | (A-2) | CYCLOMER M100 | | | | | 95 |
| (B) | (B-1) | JP-200 | 25 | 25 | 25 | 25 | 5 |
| | (B-2) | EHPE3150 | | | | | |
| | (B-3) | EP-4088S | | | | | |
| | (B-4) | jER 828 | | | | | |
| | (B-5) | jER 806 | | | | | |
| | (B-6) | YL983U | | | | | |
| | (B-7) | YX-8000 | | | | | |
| | (B-8) | KRM-2490 | | | | | |
| (C) | (C-1) | Adeka Optomer SP-170 | | 1 | 1 | 1 | 1 |
| | (C-2) | CPI-200K | 1 | | | | |
| (D) | (D-1) | DAROCUR 1173 | 2 | | 2 | 2 | 2 |
| | (D-2) | ANTHRACURE UVS-1331 | | 0.5 | | | |
| (E) | (E-1) | Crown ether O-18 | | | | | |
| | (E-2) | Crown ether O-15 | | | | | |
| | (E-3) | Dicyclohexano-18-crown-6-ether | | | | | |
| (F) | (F-1) | KBM-403 | 3 | 3 | | | 3 |
| | (F-2) | KBE-403 | | | 3 | | |
| | (F-3) | A-174 | | | | 3 | |
| (G) | (G-1) | SFP-30M | | | | | |
| | (G-2) | SFP-30MHE | | | 3 | | |
| | (G-3) | R-974 | | | | 3 | |
| | (G-4) | ASFP-30 | | | | | 3 |
| Moisture Content | ppm | | 900 | 850 | 950 | 900 | 100 |
| Chlorine Content | ppm | | <100 | <100 | <100 | <100 | <100 |
| Viscosity [mPa·s] at 25° C. | | | 850 | 870 | 860 | 840 | 100 |

TABLE 3-continued

| Component [parts by mass] | | Example 14 | Example 15 | Example 16 | Example 17 | Example 18 |
|---|---|---|---|---|---|---|
| Moisture Permeation Rate [g/(m2 · 24 hr)] | 60° C., 90% RH | 68 | 66 | 65 | 71 | 70 |
| Tensile Shear Bond Strength | Mpa | 21 | 20 | 20 | 18 | 28 |
| Adhesive Durability (PCT) [%] | 121° C., 100% RH, 2 atm, After 10 h | 70 | 65 | 65 | 45 | 60 |
| Organic EL Evaluation [μm] | Initial State | 0 | 0 | 0 | 10 | 0 |
| | Durability (85° C. 85% RH) After 1000 h | 25 | 25 | 65 | 80 | 30 |
| Storage Stability Evaluation | 40° C., After 4 weeks Viscosity Change (V4/V0) | 1.7 | 1.7 | 1.7 | 1.7 | 2.2 |

TABLE 4

| Component [parts by mass] | | | Comparative Example 1 | Comparative Example 2 | Comparative Example 3 | Comparative Example 4 | Comparative Example 5 |
|---|---|---|---|---|---|---|---|
| (A) | (A-1) | CELLOXIDE 2021P | 95 | 75 | 100 | | 95 |
| | (A-2) | CYCLOMER M100 | | | | | |
| (B) | (B-1) | JP-200 | 5 | | | 100 | 5 |
| | (B-2) | EHPE3150 | | | | | |
| | (B-3) | EP-4088S | | | | | |
| | (B-4) | jER 828 | | | | | |
| | (B-5) | jER 806 | | | | | |
| | (B-6) | YL983U | | | | | |
| | (B-7) | YX-8000 | | | | | |
| | (B-8) | KRM-2490 | | 25 | | | |
| (C) | (C-1) | Adeka Optomer SP-170 | 1 | 1 | 1 | 1 | |
| | (C-2) | CPI-200K | | | | | |
| (D) | (D-1) | DAROCUR 1173 | 2 | 2 | 2 | 2 | 2 |
| | (D-2) | ANTHRACURE UVS-1331 | | | | | |
| (E) | (E-1) | Crown ether O-18 | | | | | |
| | (E-2) | Crown ether O-15 | | | | | |
| | (E-3) | Dicyclohexano-18-crown-6-ether | | | | | |
| (F) | (F-1) | KBM-403 | 3 | 3 | 3 | 3 | 3 |
| | (F-2) | KBE-403 | | | | | |
| | (F-3) | A-174 | | | | | |
| (G) | (G-1) | SFP-30M | | | | | |
| | (G-2) | SFP-30MHE | | | | | |
| | (G-3) | R-974 | | | | | |
| | (G-4) | ASFP-30 | | | | | |
| Moisture Content | ppm | | 1500 | 1300 | 100 | 100 | 100 |
| Chlorine Content | ppm | | <100 | 1500 | <100 | <100 | <100 |
| Viscosity [mPa · s] at 25° C. | | | 250 | 340 | 220 | 500,000 | 260 |
| Moisture Permeation Rate [g/(m2 · 24 hr)] | 60° C., 90% RH | | 65 | 120 | 100 | 55 | No Curing |
| Tensile Shear Bond Strength | Mpa | | 22 | 13 | 21 | 25 | |
| Adhesive Durability (PCT) [%] | 121° C., 100% RH, 2 atm, After 10 h | | 80 | 20 | 80 | 50 | |
| Organic EL Evaluation [μm] | Initial State | | 40 | 10 | 0 | 0 | |
| | Durability (85° C. 85% RH) After 1000 h | | 350 | 390 | 250 | 210 | |
| Storage Stability Evaluation | 40° C., After 4 weeks Viscosity Change (V4/V0) | | 2.9 | 2.8 | 3.1 | 3.3 | — |

The above experimental examples demonstrate the following. The embodiments of the present invention can provide a resin composition having accurate coating properties, excellent adhesiveness, low moisture permeability, and excellent adhesive durability while a trace amount of the resin composition is used. That the resin compositions according to the embodiments have low moisture permeability was supported by the fact that the moisture permeation rate was low. For example, when the component (D) was used, the durability of the organic EL was increased (when Examples 1 to 9 and 14 to 18 were compared with Examples 10 to 13).

INDUSTRIAL APPLICABILITY

The resin compositions according to the present invention have increased adhesiveness and a very low moisture permeation rate without deteriorating the organic EL element. The resin compositions according to the present invention are preferably applicable to attachment of electronics products, in particular, display parts (e.g., organic EL elements), electronic components (e.g., image sensors such as CCD and CMOS), and element packages used for semiconductor components. The resin compositions, in particular, are optimal for attachment to seal an organic EL element and can satisfy the properties required for an adhesive used for packaging of a device such as an organic EL element.

The invention claimed is:

1. A resin composition comprising:
   an epoxy component consisting of (A) an epoxy compound having a number-average molecular weight of less than 300 and (B) an epoxy resin having a number-average molecular weight of from 300 to 5000; and
   (C) a photocationic polymerization initiator,
   wherein moisture content is 500 ppm or less and chlorine content is 1000 ppm or less,
   wherein the epoxy compound (A) is an alicyclic epoxy compound containing at least one epoxy group and at least one ester group per molecule, and
   wherein the epoxy resin is a bisphenol A-type epoxy resin or a bisphenol F-type epoxy resin.

2. The resin composition according to claim 1, further comprising (D) a sensitizer.

3. The resin composition according to claim 1, further comprising (E) a stabilizer.

4. The resin composition according to claim 3, wherein the stabilizer (E) is an ether compound.

5. The resin composition according to claim 3, wherein the stabilizer (E) is a cyclic ether compound.

6. The resin composition according to claim 1, further comprising (F) a silane coupling agent.

7. An adhesive comprising the resin composition according to claim 1.

8. A process for producing the resin composition according to claim 1, comprising:
   (1) a step of decreasing moisture content of each component before mixing and then subjecting each component to the mixing; and/or
   (2) a step of decreasing moisture content of each component after mixing.

9. The production process according to claim 8, wherein the step of decreasing moisture content in step (1) or step (2) comprises at least one step selected from the group consisting of:
   (a) a step of removing moisture content by using a desiccant and then separating the desiccant by decantation or filtration;
   (b) a step of removing moisture content by heating under a reduced pressure condition;
   (c) a step of distillation and refinement under a reduced pressure condition;
   (d) a step of removing moisture content by introducing inert gas such as dry nitrogen or dry argon gas into each component; and
   (e) a step of removing moisture content by lyophilization.

10. A sealant for an organic EL element, comprising the resin composition or the adhesive according to claim 1.

11. A cured product obtainable by curing the resin composition or the adhesive according to claim 1.

12. An organic EL device obtainable by using the resin composition or the adhesive according to claim 1.

13. A display obtainable by using the resin composition or the adhesive according to claim 1.

14. A flexible display or an organic EL device obtainable by using the resin composition or the adhesive according to claim 1.

15. A method for manufacturing an organic EL device, comprising:
   a step of applying the sealant for an organic EL element according to claim 10 onto a whole surface or part of a substrate and then irradiating the substrate with light; and
   a step of attaching the substrate to the organic EL element for sealing of the organic EL element until the sealant for the organic EL element is cured.

* * * * *